(12) United States Patent
Miyata et al.

(10) Patent No.: US 6,981,808 B2
(45) Date of Patent: Jan. 3, 2006

(54) SUBSTRATE PROCESSING APPARATUS AND SUBSTRATE TRANSFERRING METHOD

(75) Inventors: Akira Miyata, Kumamoto (JP); Makio Higashi, Kumamoto (JP); Shigeki Wada, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 394 days.

(21) Appl. No.: 10/354,194

(22) Filed: Jan. 30, 2003

(65) Prior Publication Data

US 2003/0147643 A1   Aug. 7, 2003

(30) Foreign Application Priority Data

Jan. 31, 2002   (JP) .............................. 2002-023698

(51) Int. Cl.
   *G03D 5/00*   (2006.01)
   *B65H 1/00*   (2006.01)
   *B65G 49/07*  (2006.01)

(52) U.S. Cl. .................. 396/611; 414/222.01; 414/935

(58) Field of Classification Search ................ 396/611; 414/935, 936, 937, 939, 940, 941, 222.1, 414/222.2; 700/213, 214; 355/27
See application file for complete search history.

(56) References Cited

U.S. PATENT DOCUMENTS

| 5,024,570 | A | * | 6/1991 | Kiriseko et al. | ........ 414/222.06 |
| 6,126,338 | A | * | 10/2000 | Akimoto | ..................... 396/611 |
| 6,126,703 | A | | 10/2000 | Akimoto et al. | |
| 6,264,705 | B1 | | 7/2001 | Akimoto et al. | |
| 6,281,962 | B1 | * | 8/2001 | Ogata et al. | .................. 355/27 |
| 6,293,713 | B1 | | 9/2001 | Ueda | |

* cited by examiner

*Primary Examiner*—Alan Mathews
(74) *Attorney, Agent, or Firm*—Oblon, Spivak, McClelland, Maier & Neustadt, P.C.

(57) ABSTRACT

A resist coating/developing system comprises a cassette station, a process station, and an interface station. A second wafer transfer member for transferring the wafer from a high precision temperature control unit mounted to the interface station to an in-stage of a light exposure device provisionally disposes the wafer held by the second wafer transfer member on a restoration unit in the case where the wafer was taken out from the high precision temperature control unit because it was possible to transfer the wafer onto the in-stage, but it was rendered impossible later to transfer the wafer W onto the in-stage.

17 Claims, 6 Drawing Sheets

SUBSTRATE PROCESSING APPARATUS AND SUBSTRATE TRANSFERRING METHOD

BACKGROUND OF THE INVENTION

1. Field of the Invention

The present invention relates to a substrate processing apparatus for coating, for example, a semiconductor wafer with a resist solution, followed by developing the resist film after the light exposure, and a substrate transferring method in a substrate processing apparatus.

2. Description of the Related Art

In the manufacture of, for example, a semiconductor device, employed is a photolithography technology in which a semiconductor wafer is coated with a resist solution so as to form a resist film, followed by exposing the resist film to light by using a photo mask and subsequently developing the resist film after the light exposure so as to form a desired resist pattern on the substrate. It was customary in the past to use a resist coating/developing system for carrying out the series of processes described above.

The particular resist coating/developing system is equipped with various process units for individually carrying out a series of processes required for the resist coating and the developing processing. For example, the particular system is equipped with a process station provided with various process units for carrying out a resist coating for coating a wafer with a resist solution, a developing processing for developing the wafer after completion of the light exposure, and a heat treatment for heating the wafer after the resist coating or after the developing processing. Also, since the resist coating/developing system is arranged adjacent to a light exposure device, the resist coating/developing system is equipped with an interface station provided with a wafer transfer device for transferring the wafer into and out of the light exposure device.

In general, the light exposure device includes a transfer-in stage on which a wafer is disposed for transferring the wafer into the light exposure device and a transfer-out stage on which the wafer after completion of the light exposure is disposed for transferring the wafer out of the light exposure device. During the processing of the wafer, the light exposure device and the resist coating/developing system are put in an in-line state, i.e., the state that the bidirectional communication of a control system is established, in order to carry out smoothly the transfer of the wafer between the light exposure device and the resist coating/developing system.

The light exposure device transmits a signal for permitting the transfer of the wafer into the transfer-in stage, hereinafter referred to as a "permitting signal", or a signal for inhibiting the transfer of the wafer into the transfer-in stage, hereinafter referred to as an "inhibiting signal, to the resist coating/developing system. For example, a wafer transfer device arranged in the interface station transfers the wafer from a prescribed unit arranged in the process station into the transfer-in stage in accordance with the permitting signal. On the other hand, where an inhibiting signal is transmitted from the light exposure device, the wafer transfer device is controlled not to transfer the wafer into the transfer-in stage.

The light exposure device also transmits a signal for designating the transfer of the wafer out of the transfer-out stage, hereinafter referred to as a "transfer-out designating signal", to the resist coating/developing system. For example, the wafer transfer device arranged in the interface section transfers the wafer out of the transfer-out stage into a prescribed unit arranged in the process station in accordance with the transfer-out designating signal. On the other hand, where a transfer-out signal is not transmitted from the light exposure device, the wafer transfer device is controlled not to be capable of gaining access to the transfer-out stage.

However, there is a case where the wafer transfer device takes out the wafer from a prescribed unit of the process station in accordance with a permitting signal from the light exposure device and, then, an inhibiting signal is transmitted from the light exposure device so as to inhibit the transfer of the wafer onto the transfer-in stage. In this case, the wafer transfer device is held stationary while holding the wafer. Alternatively, the inhibiting signal is neglected so as to cause the wafer transfer device to transfer the wafer onto the transfer-in stage.

It should be noted that, where the operation of the wafer transfer device is stopped while holding the wafer, it is impossible to carry out the other operation, e.g., the operation to bring the wafer after completion of the light exposure treatment back to the process station, because the wafer transfer device keeps the holding state of the wafer until the light exposure device transmits the next permitting signal. As a result, it is possible for the necessity of stopping the processing of the wafer in the process station to be generated. On the other hand, where the inhibiting signal is neglected so as to cause the wafer to be transferred onto the transfer-in stage, it is possible for the delivery of the wafer onto the transfer-in stage to result in failure so as to generate problems. For example, the wafer drops down so as to be broken. Also, damages are done to the wafer transfer device or the transfer-in stage.

Also, there is a case where the wafer transfer device is urged in a manner to gain access to the transfer-out stage upon transmission of a transfer-out designating signal from the light exposure device and, then, the transfer-out designating signal is cut off before completion of the access. In this case, the wafer transfer device is held stationary until the transfer-out designating signal is transmitted again from the light exposure device. Alternatively, the cutting off of the transfer-out designating signal is neglected so as to cause the wafer transfer device to be urged to gain access to the transfer-out stage.

Where the wafer transfer device is held stationary until the transfer-out designating signal is transmitted again, the transfer of the wafer is not carried out between the process station and the light exposure device. On the other hand, where the inhibiting signal is neglected so as to cause the wafer transfer device to be urged to gain access to the transfer-out stage, it is possible for the delivery of the wafer to result in failure so as to give rise to problems. For example, the wafer drops down so as to be broken. Also, damages are done to the wafer transfer device and the transfer-out stage.

BRIEF SUMMARY OF THE INVENTION

A first object of the present invention is to provide a substrate processing apparatus and a substrate transferring method, which make it possible to prevent the operation of the substrate transfer device from being stopped in the case where the receiving side of the substrate abruptly inhibits the transfer of the substrate when the substrate transfer device transfers the substrate.

A second object of the present invention is to provide a substrate processing apparatus and a substrate transferring method, which make it possible to prevent the substrate, which is being transferred, from being broken and to prevent the substrate transfer device from being broken in the case where the receiving side of the substrate abruptly inhibits the transfer of the substrate when the substrate transfer device transfers the substrate.

A third object of the present invention is to provide a substrate processing apparatus and a substrate transferring method, which make it possible to prevent the operation of the substrate transfer device from being stopped in the case where the taking out of the substrate by the substrate transfer device is abruptly inhibited during the process of gaining access to the substrate to be taken out.

Further, a fourth object of the present invention is to provide a substrate processing apparatus and a substrate transferring method, which make it possible to prevent the substrate and the substrate transfer device from being broken in the case where the taking out of the substrate by the substrate transfer device is abruptly inhibited during the process of gaining access to the substrate to be taken out.

According to a first aspect of the present invention, there is provided a substrate processing apparatus, comprising:

a first process unit for applying a first processing to a substrate;

a second process unit for applying a second processing to the substrate upon completion of the first processing applied by said first process unit;

a substrate transfer device for transferring the substrate between the first process unit and the second process unit;

a control device for controlling said substrate transfer device;

a detecting mechanism for detecting whether the second process unit is in the state of permitting or inhibiting the transfer of the substrate thereinto so as to transmit to the control device a permitting signal for permitting the transfer of the substrate into the second process unit and an inhibiting signal for inhibiting the transfer of the substrate into the second process unit; and a provisional substrate disposing unit for provisionally disposing the substrate transferred out of the first process unit;

wherein, the control device controls the substrate transfer device such that the substrate is disposed on the provisional substrate disposing unit where the control device has received the inhibiting signal transmitted from the detecting mechanism after the control device has permitted the substrate transfer device to taking out the substrate from the first process unit in accordance with the permitting signal transmitted from the detecting mechanism.

According to a second aspect of the present invention, there is provided a substrate processing apparatus, comprising:

a cassette station on which is disposed a cassette having a plurality of substrates housed therein;

a process station for applying a prescribed processing to the substrate;

a first substrate transfer device for transferring the substrate between the cassette station and the process station;

an interface station including a second substrate transfer device for transferring the substrate between another substrate processing apparatus arranged adjacent to the process station and the process station and a provisional substrate disposing unit for provisionally disposing thereon the substrate taken out from the process station;

a control device for controlling the second substrate transfer device; and a detecting mechanism for detecting whether said another substrate processing apparatus is in the state of permitting or inhibiting the transfer of the substrate and for transmitting to the control device a permitting signal for permitting the transfer of the substrate into said another substrate processing apparatus and an inhibiting signal for inhibiting the transfer of the substrate into said another substrate processing apparatus;

wherein the control device controls the second substrate transfer device such that the substrate is disposed on the provisional substrate disposing unit where the control device has received the inhibiting signal transmitted from the detecting mechanism after the control device has permitted the second substrate transfer device to taking out the substrate from the process station in accordance with the permitting signal transmitted from the detecting mechanism.

According to a third aspect of the present invention, there is provided a substrate processing apparatus for applying to a substrate a series of processes ranging between the formation of a resist film and the development, comprising:

a cassette station on which is disposed a cassette having a plurality of substrates housed therein;

a process station including a plurality of process units for applying to the substrate processes to form a resist film on the substrate and to develop the resist film and the heat treatments accompanying the formation and development of the resist film;

a first substrate transfer device for transferring the substrate between the cassette station and the process station;

an interface station including a second substrate transfer device for transferring the substrate between a light exposure device arranged adjacent to the process station and the process station and a provisional substrate disposing unit for provisionally disposing thereon the substrate transferred out of the process station;

a control device for controlling the second substrate transfer device; and a detecting mechanism for detecting whether the light exposure device is in the state of permitting or inhibiting the transfer of the substrate thereinto so as to transmit to the control device a permitting signal for permitting the transfer of the substrate into the light exposure device and an inhibiting signal for inhibiting the transfer of the substrate into the light exposure device;

wherein the control device controls the second substrate transfer device such that the substrate is disposed on the provisional substrate disposing unit where the control device has received the inhibiting signal transmitted from the detecting mechanism after the control device has permitted the second substrate transfer device to take out the substrate from the process station in accordance with the permitting signal transmitted from the detecting mechanism,.

According to a fourth aspect of the present invention, there is provided a substrate processing apparatus, comprising:

a cassette station on which is disposed a cassette having a plurality of substrates housed therein;

a process station for applying a prescribed processing to the substrate;

a first substrate transfer device for transferring the substrate between the cassette station and the process station;

an interface station including a substrate disposing unit for disposing thereon only that substrate which is to be transferred to another substrate processing apparatus arranged adjacent to the process station, a second substrate transfer device capable of transferring the substrate between the process station and the substrate disposing unit, a third substrate transfer device capable of transferring the substrate between the substrate disposing unit and said another substrate processing apparatus, and a provisional substrate disposing unit arranged in parallel to the substrate disposing unit for provisionally disposing thereon the substrate taken out from the substrate disposing unit;

a control device for controlling the third substrate transfer device; and a detecting mechanism for detecting whether said another substrate processing apparatus is in the state of permitting or inhibiting the transfer of the substrate thereinto so as to transmit to the control device a permitting signal for permitting the transfer of the substrate into said another substrate processing apparatus and an inhibiting signal for inhibiting the transfer of the substrate into said another substrate processing apparatus;

wherein the control device controls the third substrate transfer device such that the substrate is disposed on the provisional substrate disposing unit where the control device has received the inhibiting signal transmitted from the detecting mechanism after the control device has permitted the third substrate transfer device to take out the substrate from the substrate disposing unit in accordance with the permitting signal transmitted from the detecting mechanism.

According to a fifth aspect of the present invention, there is provided a substrate processing apparatus, comprising:

a process unit for applying a prescribed treatment to a substrate;

a substrate transfer device including a transfer-out member for taking out the substrate from the process unit;

a control device for controlling the substrate transfer device; and a detecting mechanism for detecting whether the process unit is in the state of permitting or inhibiting the taking out of the substrate therefrom so as to transmit to the control device a permitting signal for permitting the access of the substrate transfer device to the process unit and an inhibiting signal for inhibiting the access of the substrate transfer device to the process unit;

wherein the control device controls the substrate transfer device such that the substrate transfer device is allowed to start its operation to gain access to the process unit in accordance with the permitting signal transmitted from the detecting mechanism, the control device confirms again the signal transmitted from the detecting mechanism immediately before the transfer-out member is allowed to gain access to the process unit after the start-up of the operation of the substrate transfer device to gain access to the process unit, the transfer-out member is allowed to gain access to the process unit in the case where the signal transmitted from the detecting mechanism is reconfirmed to be a permitting signal so as to take out the substrate from the process unit, and the access of the transfer-out member to the process unit is stopped in the case where the signal is changed to the inhibiting signal.

According to a sixth aspect of the present invention, there is provided a substrate processing apparatus, comprising:

a cassette station for disposing thereon a cassette having a plurality of substrates housed therein;

a process station for applying a prescribed processing to the substrate a first substrate transfer device for transferring the substrate between the cassette station and the process station;

an interface station including a second substrate transfer device for transferring the substrate between another substrate processing apparatus arranged adjacent to the process station and the process station;

a control device for controlling the second substrate transfer device; and a detecting mechanism for detecting whether the another substrate processing apparatus is in the state of permitting or inhibiting the taking out the substrate therefrom so as to transmit to the control device a permitting signal for permitting the access of the second substrate transfer device to said another substrate processing apparatus and an inhibiting signal for inhibiting the access of the second substrate transfer device to said another substrate processing apparatus;

wherein:

the second substrate transfer device includes a transfer-out member for taking out the substrate from said another substrate processing apparatus; and the control device controls the second substrate transfer device such that the operation of the second substrate transfer device to gain access to said another substrate processing apparatus is started in accordance with the permitting signal transmitted from the detecting mechanism, the control device confirms again the signal transmitted from the detecting mechanism immediately before the transfer-out member is allowed to gain access to said another substrate processing apparatus after start up of the operation of the second substrate transfer device to gain access to said another substrate processing apparatus, the transfer-out member is allowed to gain access to said another substrate processing apparatus in the case where the signal transmitted from the detecting signal is reconfirmed to be the permitting signal so as to take out the substrate from said another substrate processing apparatus, and the access of the transfer-out member to said another substrate processing apparatus is stopped in the case where the signal is changed to the inhibiting signal.

According to a seventh aspect of the present invention, there is provided a substrate processing apparatus for applying a series of processes ranging between the formation of a resist film and the development to a substrate, comprising:

a cassette station for disposing thereon a cassette having a plurality of substrates housed therein;

a process station including a plurality of process units for forming a resist film on the substrate and applying a developing processing to the resist film and for applying heat treatments accompanying the formation of the resist film and the developing processing to the substrate;

a first substrate transfer device for transferring the substrate between the cassette station and the process station;

an interface station including a second substrate transfer device for transferring the substrate between a light exposure device arranged adjacent to the process station and the process station and a provisional substrate disposing unit for provisionally disposing thereon the substrate taken out from the process station;

a control device for controlling the second substrate transfer device; and a detecting mechanism for detecting whether the light exposure device is in the state of permitting or inhibiting the transfer of the substrate thereinto so as to transmit to the control device a permitting signal for permitting the transfer of the substrate into the light exposure device and an inhibiting signal for inhibiting the transfer of the substrate into the light exposure device;

wherein:

the second substrate transfer device includes a transfer-out member for taking out the substrate from the light exposure device; and the control device controls the second substrate transfer device such that the second substrate transfer device is allowed to start its operation to gain access to the light exposure device in accordance with the permitting signal transmitted from the detecting mechanism, the control devices confirms again the signal transmitted from the detecting mechanism immediately before the transfer-out member of the second substrate transfer device gains access to the light exposure device after start-up of the operation of the second substrate transfer device to gain access to the light exposure device, the transfer-out member is allowed to gain access to the light exposure device in the case where the signal transmitted from the detecting mechanism is reconfirmed to be the permitting signal so as to take out the substrate from the light exposure device, and the access of the transfer-out member to the light exposure device is stopped in the case where the signal is changed to the inhibiting signal.

According to an eighth aspect of the present invention, there is provided a method of transferring a substrate from a first process unit to a second process unit, said first process unit being for applying a first processing to the substrate, and said second process unit being for applying a second processing to the substrate, comprising the steps of:

taking out the substrate after completion of the first processing from the first process unit;

provisionally disposing the substrate on a provisional substrate disposing unit for provisionally disposing the substrate, when the transfer of the substrate taken out from the first process unit into the second process unit is inhibited; and transferring the substrate disposed on the provisional substrate disposing unit into the second process unit when the second process unit is changed from the state of inhibiting the transfer of the substrate into the second process unit into the state of permitting the transfer of the substrate into the second process unit.

According to a ninth aspect of the present invention, there is provided a method of transferring a substrate from a first process unit to a second process unit by a substrate transfer device, said first process unit being for applying a first processing to the substrate, and said second process unit being for applying a second processing to the substrate, comprising the steps of:

taking out the substrate after completion of the first processing from the first process unit after the second process unit is reconfirmed to be in the state of permitting the transfer of the substrate thereinto;

reconfirming whether the second process unit is in the state of permitting or inhibiting the transfer of the substrate thereinto immediately before the substrate is transferred into the second process unit;

controlling the substrate transfer device such that the substrate is transferred into the second process unit when the second process unit is reconfirmed to be in the state of permitting the transferring the substrate thereinto, such that the substrate is transferred into the second process unit at a time when the second process unit is changed from the state of permitting the transfer of the substrate into the state of inhibiting the transfer of the substrate and the second process unit is changed into the sate of permitting the transfer of the substrate in a prescribed time from the reconfirming time, and such that the substrate is provisionally disposed on a provisional substrate disposing unit the prescribed time later when the second process unit is changed from the state of permitting the transfer of the substrate into the state of inhibiting the transfer of the substrate and the second process unit is not changed into the state of permitting the transfer of the substrate in the prescribed time after the reconfirming time;

taking out the substrate from the provisional substrate disposing unit when the second process unit is changed from the state of inhibiting the transfer of the substrate into the state of permitting the transfer of the substrate after the substrate is disposed on the provisional substrate disposing unit; and transferring the substrate while confirming the state of the second process unit until the substrate taken out from provisional substrate disposing unit is transferred into the second process unit.

According to a tenth aspect of the present invention, there is provided a method of transferring a substrate from a resist coating/developing section to a light exposure section by a substrate transfer device, said resist coating/developing section including a plurality of process units for forming a resist film on a substrate, developing the formed resist film and applying heat treatments accompanying the formation and development of the resist film to the substrate, and said light exposure section being for applying a light exposure to the substrate having the resist film formed thereon, comprising the steps of:

taking out the substrate having the resist film formed thereon from the resist coating/developing section after the light exposure section is confirmed to be in the state of permitting the transfer of the substrate thereinto;

reconfirming whether the light exposure section is in the state of permitting or inhibiting the transfer of the substrate thereinto immediately before the substrate is transferred into the light exposure section;

controlling the substrate transfer device such that the substrate is transferred into the light exposure section when the light exposure section is reconfirmed to be in the state of permitting the transfer of the substrate thereinto, such that the substrate is transferred into the light exposure section at the time when the light exposure section is changed from the state of permitting the transfer of the substrate into the state of inhibiting the transfer of the substrate and the light exposure section is changed into the state of permitting the transfer of the substrate in a prescribed time after the reconfirming time, and such that the substrate is provisionally disposed on a provisional substrate disposing unit the prescribed time later when the light exposure section is changed from the state of permitting the transfer of the substrate into the state of inhibiting the transfer of the substrate and the light exposure section is not changed into the state of permitting the transfer of the substrate in the prescribed time after the reconfirming time;

taking out the substrate from the provisional substrate disposing unit when the light exposure section is changed from the state of inhibiting the transfer of the substrate into the state of permitting the transfer of the substrate after the substrate is disposed on the provisional substrate disposing unit; and transferring the substrate while confirming the state of the light exposure section until the substrate taken out from the provisional substrate disposing unit is transferred into the light exposure section.

According to an eleventh aspect of the present invention, there is provided a method of transferring a substrate, comprising the steps of:

allowing a substrate transfer device for taking out the substrate from a process unit for applying a prescribed processing to the substrate to start its operation to gain access to the process unit in accordance with a signal for permitting the taking out of the substrate from the process unit onto the substrate transfer device; and allowing the substrate transfer device to confirm a signal transmitted from the process unit immediately before the substrate transfer device gains access to the substrate to be taken out from the process unit, allowing the substrate transfer device to take out the substrate from the process unit when the signal is confirmed to be a signal for permitting the taking out of the substrate, and stopping the access of the substrate transfer device to the substrate when the signal is confirmed to be a signal for inhibiting the taking out of the substrate from the process unit.

Further, according to a twelfth aspect of the present invention, there is provided a method of transferring a substrate, comprising the steps of:

allowing a substrate transfer device for taking out a substrate from a light exposure section in which a light exposure is applied to the substrate having a resist film formed thereon to start its operation to gain access to the light exposure section in accordance with a substrate transfer-permitting signal transmitted from the light exposure section onto the substrate transfer device; and allowing the substrate transfer device to confirm a signal transmitted from the light exposure section immediately before the substrate transfer device gains access to the substrate taken out from the light exposure section, allowing the substrate transfer device to take out the substrate from the light exposure section when the signal is confirmed to be a signal for permitting the taking out of the substrate, and stopping the access of the substrate transfer device to the substrate when the signal is confirmed to be a signal for inhibiting the taking out of the substrate from the light exposure section.

A provisional substrate disposing unit is used in each of the substrate processing apparatus according to the first to fourth aspects of the present invention and the method for transferring the substrate according to the eighth to tenth aspects of the present invention. As a result, the substrate under transfer can be provisionally disposed on the provisional substrate disposing unit even in the case where, for example, the process unit on the receiving side of the substrate abruptly inhibits the transfer of the substrate into the process unit. It follows that the substrate under transfer can be protected. Also, it is possible to avoid the damage done to the process unit and the substrate transfer device in the case where the substrate is forcedly transferred into, for example, the process unit on the receiving side of the substrate.

Also, according to the substrate processing apparatus according to the fifth to seventh aspects of the present invention and the method for transferring the substrate according to the eleventh and twelfth aspects of the present invention, the states of permitting and inhibiting the taking out of the substrate are reconfirmed immediately before the substrate transfer device gains access to the substrate for taking out the substrate. It follows that it is possible to avoid the damages done to, for example, the substrate and the substrate transfer device.

DETAILED DESCRIPTION OF THE INVENTION

Figure 1:
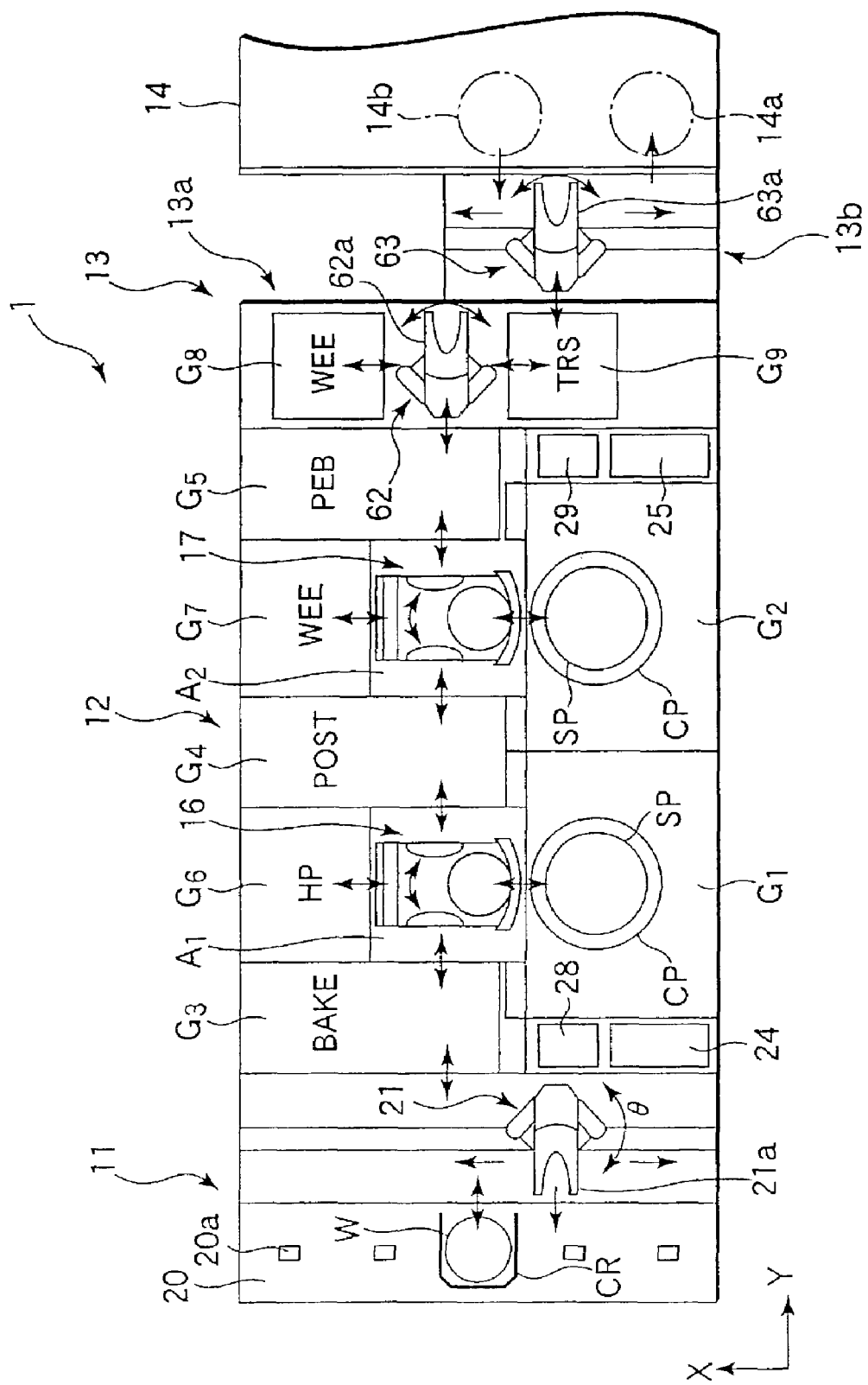
FIG. 1 is a plan view schematically showing the construction of a resist coating/developing system.
Figure 2:
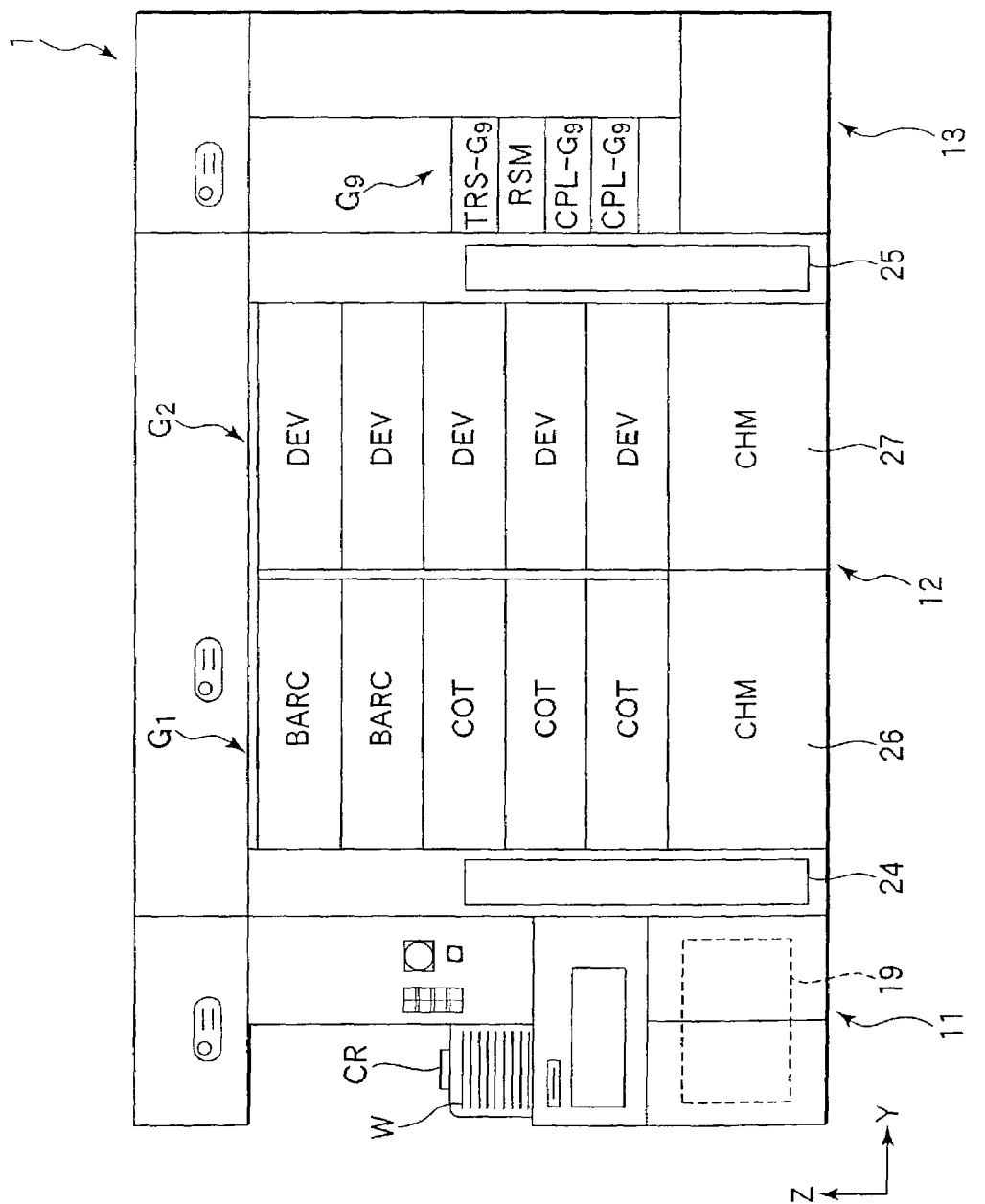
FIG. 2 is a front view schematically showing the construction of the resist coating/developing system shown in FIG. 1.
Figure 3:
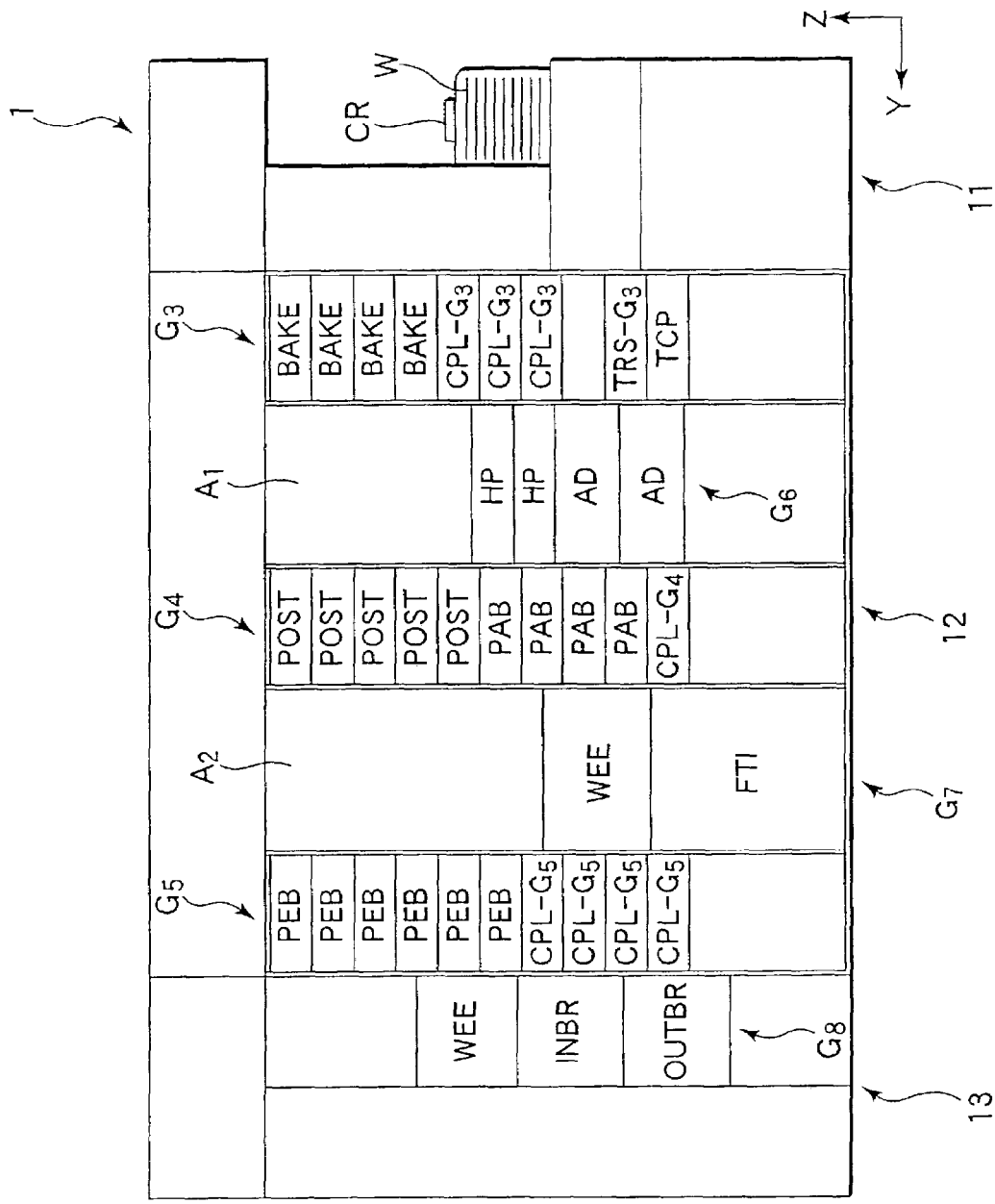
FIG. 3 is a back view schematically showing the construction of the resist coating/developing system shown in FIG. 1.

Some embodiments of the present invention will now be described in detail with reference to the accompanying drawings. The following description covers a resist coating/developing system in which a semiconductor wafer is coated with a resist solution and the wafer exposed to light is subjected to a developing processing. FIG. 1 is a plan view schematically showing the construction of a resist coating/developing system 1, and FIGS. 2 and 3 are a front view and a back view, respectively, schematically showing the construction of the resist coating/developing system 1 shown in FIG. 1.

As shown in the drawings, the resist coating/developing system 1 comprises a cassette station 11 acting as a transfer station, a process station 12 including a plurality of process units, and an interface station 13 for transferring a wafer W between a light exposure device 14 arranged adjacent to the process station 12 and the process station 12.

A wafer cassette CR housing a plurality of wafers W, e.g., 25 wafers, which are to be processed in the resist coating/developing system 1, is transferred from another system onto the cassette station 11. By contraries, the wafer cassette CR housing the wafer W after completion of the processing in the resist coating/developing system 1 is transferred from the cassette station 11 into another system. Further, the cassette station 11 transfers the wafer W between the wafer cassette CR and the process station 12.

As shown in FIG. 1, a plurality of positioning projections 20a, i.e., five projections 20a in FIG. 1, are arranged on a cassette table 20 in the cassette station 11 so as to form a row extending in the X-direction. The wafer cassette CR is disposed on the position of the projection 20a such that the wafer delivery port of the wafer cassette CR faces the process station 12. Incidentally, the wafers W are arranged within the wafer cassette CR so as to assume a horizontal posture and are arranged apart from each other in the vertical direction (Z-direction) substantially in parallel (FIGS. 2 and 3).

A wafer transfer mechanism 21 is arranged in the cassette station 11 so as to be positioned between the cassette table 20 and the process station 12. The wafer transfer mechanism 21 is provided with a wafer transfer pick 21a capable of movement in the cassette arranging direction (X-direction) and in the arranging direction (Z-direction) of the wafers W within the wafer cassette CR. The wafer transfer pick 21a is also swingable in the θ-direction shown in FIG. 1. It follows that the wafer transfer pick 21a is capable of selectively gaining access to any of the wafer cassettes CR and is also capable of gaining access to a transit unit (TRS-$G_3$) arranged in a third process unit group $G_3$ referred to herein later and included in the process station 12.

In the process station 12, the third process unit group $G_3$ referred to above, a fourth process unit group $G_4$ and a fifth process unit group $G_5$ are arranged in the order mentioned as viewed from the side of the cassette station 11 on the back side of the system 1, i.e., in the upper portion in FIG. 1. Also, a first main transfer section A1 is arranged between the third process unit group $G_3$ and the fourth process unit group $G_4$, and a second main transfer section A2 is arranged between the fourth process unit group $G_4$ and the fifth process unit group $G_5$. Further, a first process unit group $G_1$ and a second process unit group $G_2$ are arranged in the order mentioned as viewed from the side of the cassette station 11 in the front side of the system 1, i.e., in the lower portion in FIG. 1.

As shown in FIG. 3, the third process unit group $G_3$ includes oven-type process units for applying a prescribed processing to the wafer W disposed on a table, e.g., a high temperature heat treating unit (BAKE) for applying a prescribed heat treatment to the wafer W, a high precision temperature control unit (CPL-$G_3$) for applying a heat treatment to the wafer W under an accurately controlled temperature, a temperature control unit (TCP), and a transit unit (TRS-$G_3$) constituting a delivery section of the wafer W between the cassette station 11 and the first main transfer section A1. These process units are stacked one upon the other so as to form, for example, a 10-stage structure. Incidentally, a spare space is arranged in the third process unit group $G_3$ in the third stage from the bottom so as to make it possible to arrange, for example, a desired oven-type process unit in the spare space.

The fourth process unit group $G_4$ includes, for example, a pre-bake unit (PAB) for applying a heat treatment to the wafer after coating with a resist solution, a post-bake unit (POST) for applying a heat treatment to the wafer W after the developing processing, and a high precision temperature control unit (CPL-$G_4$). These process units are stacked one upon the other so as to form, for example, a 10-stage structure. Further, the fifth process unit group $G_5$ includes, for example, a post-exposure bake unit (PEB) for applying a heat treatment to the wafer W after the light exposure and before the developing processing, and a high precision temperature control unit (CPL-$G_5$). These process units are stacked one upon the other so as to form, for example, a 10-stage structure.

As shown in FIGS. 1 and 3, a sixth process unit group $G_6$ including an adhesion unit (AD) and a heating unit (HP) for heating the wafer is arranged behind the first main transfer section A1. It is possible to impart the function of controlling the temperature of the wafer W to the adhesion unit (AD).

A seventh process unit group $G_7$ including a peripheral light exposure device (WEE) for selectively exposing the edge portion alone of the wafer W to light and a film thickness measuring device (FTI) for measuring the thickness of the resist film is arranged behind the second main transfer section A2. It is possible for the peripheral light exposure devices (WEE) to be arranged one upon the other so as to form a multi-stage structure. Also, it is possible to arrange a heat treating unit such as a heating unit (HP) behind the second main transfer section A2 as well as behind the first main transfer section A1.

As shown in FIGS. 1 and 2, the first process unit group $G_1$ includes five spinner type process units each used as a liquid supply unit for applying a prescribed processing to the wafer W disposed on a spin chuck SP within a cup (CP), e.g., three resist coating units (COT) and two bottom coating units (BARC) for forming an antireflection film for preventing the reflection of the light in the light exposure step. These spinner type process units are stacked one upon the other so as to form a 5-stage structure. On the other hand, five spinner type process units, e.g., five developing units (DEV), are stacked one upon the other in the second process unit group $G_2$ so as to form a 5-stage structure.

A first main wafer transfer device 16 is arranged in the first main transfer section A1. The first main wafer transfer device 16 is capable of selectively gaining access to each of the process units included in the first process unit group $G_1$, the third process unit group $G_3$, the fourth process unit group $G_4$, and the sixth process unit group $G_6$. Also, second main wafer transfer device 17 is arranged in the second main transfer section A2. The second main wafer transfer device 17 is capable of selectively gaining access to each of the process units included in the second process unit group $G_2$, the fourth process unit group $G_4$, the fifth process unit group $G_5$, and the seventh process unit group $G_7$.

Figure 4:
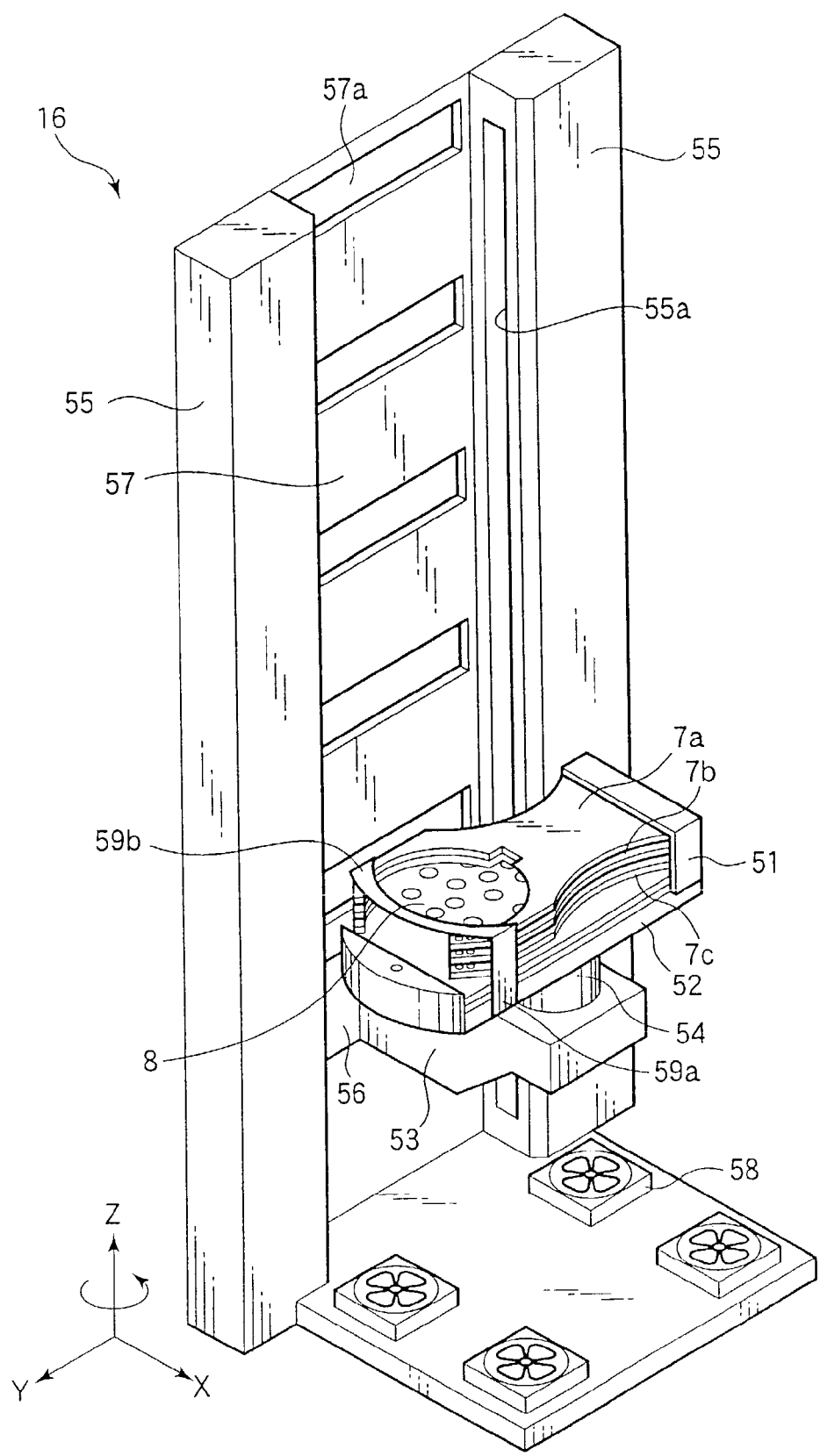
FIG. 4 is an oblique view schematically showing the construction of a main wafer transfer device.

FIG. 4 is an oblique view schematically showing the construction of the first main wafer transfer device 16. As shown in the drawing, the first main wafer transfer device 16 includes three arms 7a (upper stage), 7b (middle stage), 7c (lower stage), arm support plates 51 mounted to the proximal ends of the arms 7a to 7c (the arm support plate 51 mounted to the arm 7a alone being shown in the drawing), a base plate 52 engaged with each of the arm support plates 51, a support section 53 for supporting the base plate 52, etc., a motor (not shown) housed within the support section 53, a rotatable rod 54 joining the base plate 52 to the motor, support pillars 55 arranged on the sides of the first process unit group $G_1$ and the second process unit group $G_2$ and each having a sleeve 51 formed therein in a manner to extend in the vertical direction, a flange member 56 slidably engaged with the sleeve 55a and joined to the support section 53, and a lift mechanism (not shown) for vertically moving the flange member 56.

Rails (not shown) are formed on the base plate 52 in a manner to extend in parallel to the longitudinal direction of the base plate 52 for every arm support plate 51, with the result that each arm support plate 51 is slidable along the rail. Also, the rotatable rod 54 is rotated in accordance with rotation of the motor arranged within the support section 53 so as to permit the base plate 52 to be rotated within the X-Y plane. Further, since the support section 53 is mounted to the flange member 56 capable of movement in the Z-direction, the base plate 52 is also movable in the Z-direction.

Because of the particular construction described above, the arms 7a to 7c of the first main wafer transfer device 16 are movable in any of the X-direction, Y-direction and Z-direction and, thus, are capable of selectively gaining access to any of the process units included in the first process unit group $G_1$, the third process unit group $G_3$, the fourth process unit group $G_4$, and the sixth process unit group $G_6$ as described above.

Vertical members 59a are mounted to both sides in the tip portion of the base plate 52. Also, a shielding plate 8 positioned between the arm 7a and the arm 7b for shielding the heat radiated from these arms 7a, 7b is mounted to these vertical members 59a, and a bridging member 59b is arranged between these vertical members 59a. Further, a pair of optical sensors (not shown) are arranged in the center of the bridging member 59b and the distal end of the base plate 52 so as to make it possible to confirm the presence or absence of the wafer W, the protrusion of the wafer W, etc. in each of the arms 7a to 7c. The second main wafer transfer device 17 is substantially equal in construction to the first main wafer transfer device 16 described above.

Incidentally, a wall section 57 shown in FIG. 4 is a part of the housing of the second main transfer section A2 on the side of the first process unit group $G_1$. The wafer W is transferred between the arms 7a to 7c of the first main wafer transfer device 16 and each of the process units belonging to the first process unit group $G_1$ through a window section 57a formed in the side wall section 57. Also, four fans 58 arranged on the bottom section of the second main transfer section A2 serve to control the air pressure, temperature and humidity within the second main transfer section A2.

Liquid temperature control pumps 24, 25 for supplying a prescribed process liquid into the first process unit group $G_1$ and the second process unit group $G_2$ are arranged between the first process unit group $G_1$ and the cassette station 11 and between the second process unit group $G_2$ and the interface section 13, respectively. Further, ducts 28, 29 are arranged for supplying a clean air generated from an air controller (not shown) arranged outside the resist coating/developing system 1 into the inner spaces of the process unit groups $G_1$ to $G_5$.

The first process unit group $G_1$ to the seventh process unit group $G_7$ are detachable for the maintenance operation. Also, the panel on the back side of the process station 12 is detachable or openable. Also, chemical units (CHM) 26, 27 for supplying a prescribed process liquid into the first process unit group $G_1$ and the second process unit group $G_2$ are arranged in the lowermost stages of the first process unit group $G_1$ and the second process unit group $G_2$, respectively. Further, a central control section 19 for controlling the entire resist coating/developing system 1 is arranged in a lower portion of the cassette station 11.

The interface station 13 includes a first interface station 13a arranged on the side of the process station 12 and a second interface station 13b arranged on the side of the light exposure device 14. A first wafer transfer member 62 is arranged in the first interface section 13a in a manner to face the open portion of the fifth process unit $G_5$, and a second wafer transfer member 63 is arranged in the second interface section 13b.

The eighth process unit group $G_8$ in which the peripheral light exposure device (WEE), an in-buffer cassette (INBR) for temporarily storing the wafer W that is to be transferred into the light exposure device 14, and an out-buffer cassette (OUTBR) for temporarily storing the wafer W taken out from the light exposure device 14 are stacked one upon the other so as to form a multi-stage structure is arranged on the back side of the first wafer transfer member 62. Each of the in-buffer cassette (INBR) and the out-buffer cassette (OUTBR) is capable of housing, for example, 25 wafers W.

Also, a ninth process unit group $G_9$ in which a transit unit (TRS-$G_9$), a restoration unit (RSM) and two stages of high precision temperature control units (CPL-$G_9$) are stacked one upon the other so as to form a multi-stage structure is arranged on the side of the front surface of the first wafer transfer member 62. For example, the transit unit (TRS-$G_9$) is used for disposing thereon the wafer taken out from the light exposure device 14, and the high precision temperature control unit (CPL-$G_9$) is used for disposing thereon the wafer W that is to be transferred into the light exposure device 14. Incidentally, the restoration unit (RSM) will be described herein later in detail.

The first wafer transfer member 62 is movable in the Z-direction and swingable in the θ-direction. Also, the first wafer transfer member 62 includes a fork 62a for the wafer delivery, which is movable back and forth within the X-Y plane. The fork 62a is capable of gaining access to any of the process units included in the fifth process unit group $G_5$, the eighth process unit group $G_8$, and the ninth process unit group $G_9$ so as to make it possible to transfer the wafer W among these process units.

The second wafer transfer member 63 is movable in the X-direction and the Z-direction and swingable in the θ-direction. Also, the first wafer transfer member 63 includes a fork 63a for the wafer delivery, which is movable back and forth within the X-Y plane. The fork 63a is capable of gaining access to any of the process units included in the ninth process unit group $G_9$, an in-stage 14a and an out-stage 14b of the light exposure device so as to make it possible to transfer the wafer W among these members.

The light exposure device 14 includes a detecting device (not shown) for detecting whether or not the wafer W can be transferred into the in-stage 14a so as to transmit the detection signal to the central control section 19 of the resist coating/developing system 1. Where the detection signal is a signal (permitting signal) for permitting the transfer of the wafer W into the in-stage 14a, the central control section 19 controls the second wafer transfer member 63 so as to take out the wafer W from the high precision temperature control unit (GPL-$G_9$) and, then, to transfer the wafer W into the in-stage 14a. On the other hand, where the detection signal is an inhibiting signal for inhibiting the transfer of the wafer W into the in-stage 14a, the central control section 19 controls the second wafer transfer member 63 so as to inhibit the taking out of the wafer W from the high precision temperature control unit (CPL-$G_9$).

It should be noted, however, that there is a case where the second wafer transfer member 63 takes out the wafer W from the high precision temperature control unit (CPL-$G_9$) because the detection signal transmitted from the detecting device arranged within the light exposure device is a permitting signal but, then, the detection signal transmitted from the detecting device is changed to an inhibiting signal. For example, there is a case where the in-stage 14a performs the temperature control function and, when the temperature or the temperature uniformity of the in-stage 14a ceases to satisfy the set conditions, the detecting device inhibits the transfer of the wafer W into the in-stage 14a until the temperature or the temperature uniformity is brought back to the desired state.

In this case, the central control section 19 controls the second wafer transfer member 63 so as to dispose the wafer W held by the second wafer transfer member 63 on the restoration unit (RSM). The restoration unit (RSM) is a unit for provisionally disposing thereon the wafer W, which was taken out from the high precision temperature control unit (CPL-$G_9$) because it was possible to dispose the wafer W on the in-stage 14a, when the situation was taken place after taking out the wafer W that it was impossible to dispose the wafer W on the in-stage 14a.

The detecting device arranged within the light exposure device 14 also detects whether or not it is possible to transfer the wafer W out of the out-stage 14b when the wafer W after completion of the light exposure treatment is transferred onto the out-stage 14b so as to transmit the detection signal to the central control section 19 of the resist coating/developing system 1. Where the signal transmitted from the detecting device is a transfer designating signal for designating the transfer of the wafer W out of the out-stage 14b, the central control section 19 permits the second wafer transfer member 63 to gain access to the out-stage 14b. On the other hand, where the signal transmitted from the detecting device is a transfer suspending signal for designating the suspension of the wafer transfer out of the out-stage 14b, the central control section 19 permits the second wafer transfer member 63 to perform another processing, e.g., to transfer the wafer W from the high precision temperature control unit (CPL-$G_9$) to the in-stage 14a, without allowing the second wafer transfer member 63 to gain access to the out-stage 14b.

However, there is a case where the second wafer transfer member 63 is urged to gain access to the out-stage 14b because the detection signal transmitted from the detecting device arranged within the light exposure device 14 is a transfer designating signal and, then, the transfer designating signal transmitted from the detecting device is changed to a transfer suspending signal before the fork 63a is allowed to gain access to the wafer W. The particular situation includes a case where, for example, the out-stage 14b performs the temperature control function, and the detecting device judges that the temperature or the temperature uniformity of the wafer W disposed on the out-stage 14b fails to be put in a desired state, and includes a case where the out-stage 14b performs the aligning function and the detecting device judges that the wafers W are not aligned appropriately.

If the second wafer transfer member 63 is allowed to gain access to the out-stage 14b under the state that the detecting device transmits a transfer suspending signal, it is possible for the second wafer transfer member 63 to fail to receive the wafer W so as to cause the wafer W to drop down. It is also possible for the fork 63a to be brought into contact with the various members around the out-stage 14b so as to do damages to these members.

In order to avoid the occurrence of the situations described above, the central control section 19 reconfirms whether the signal transmitted from the detecting device is a transfer designating signal or a transfer suspending signal after the second wafer transfer member 63 is moved toward the out-stage 14b in accordance with the transfer designating signal and immediately before the fork 63a of the second wafer transfer member 63 is allowed to gain access to the out-stage 14b. Where the signal transmitted from the detecting device is reconfirmed to be a transfer designating signal, the fork 63a is allowed to gain access to the out-stage 14b so as to take out the wafer W. Also, where the signal transmitted from the detecting device is reconfirmed to be a transfer suspending signal, the access of the fork 63a to the out-stage 14b is suspended.

In the resist coating/developing system 1 of the construction described above, the wafer transfer mechanism 21 takes the wafer W out of the wafer cassette CR housing the wafers W before the processing in accordance with the order of the arrangement of the wafers W within the wafer cassette CR and, then, transfers the wafer W into the transit unit (TRS-$G_3$) belonging to the third process unit group $G_3$. The wafer W is, then, transferred by the first main wafer transfer device 16 from the transit unit (TRS-$G_3$) into, for example, the temperature control unit (TCP) belonging to the third process unit group $G_3$ so as to receive a prescribed temperature control treatment. Incidentally, it is possible for the wafer transfer mechanism 21 to transfer the wafer W from the wafer cassette CR directly into the temperature control unit (TCP).

After completion of the processing in the temperature control unit (TCP), the wafer W is transferred into the bottom coating unit (BARC) belonging to the first process unit group $G_1$ for formation of an antireflection film on the wafer W. Then, the wafer W is transferred into the heating unit (HP) belonging to the sixth process unit group $G_6$ so as to receive a prescribed heat treatment. Further, the wafer W is transferred into the high temperature heat treating unit (BAKE) belonging to the third process unit group $G_3$ so as to receive a heat treatment at a temperature higher than the processing temperature in the heating unit (HP). Incidentally, it is possible to transfer the wafer W into the adhesion unit (AD) belonging to the sixth process unit group $G_6$ so as to receive an adhesion treatment before formation of an antireflection film on the wafer W in the bottom coating unit (BARC).

In the next step, the wafer W is transferred by the first main wafer transfer device 16 from the high temperature heat treating unit (BAKE) into the high precision temperature control unit (CPL-$G_4$) belonging to the fourth process unit group $G_4$ so as to receive a prescribed temperature control treatment. The wafer W after completion of the temperature control treatment is transferred into the resist coating unit (COT) belonging to the first process unit group $G_1$ for the coating of the wafer W with a resist solution.

Incidentally, where an antireflection film is not formed on the wafer W in the bottom coating unit (BARC), it is possible to transfer the wafer W into the adhesion unit (AD) for applying an adhesion treatment to the wafer W, followed by transferring the wafer W into the high precision temperature control unit (CPL-$G_4$) so as to apply a temperature control treatment to the wafer W and subsequently transferring the wafer W from the high precision temperature control unit (CPL-$G_4$) into the resist coating unit (COT).

The wafer W coated with the resist solution is transferred into the pre-bake unit (PAB) belonging to the fourth process unit group $G_4$ so as to receive a prescribed heat treatment. In the pre-bake unit (PAB), the residual solvent is removed by evaporation from the coating film on the wafer W.

The wafer W after completion of the processing in the pre-bake unit (PAB) is transferred into the film thickness measuring device (FTI) belonging to the seventh process unit group $G_7$ for measurement of the film thickness and, then, further transferred into the peripheral light exposure device (WEE) belonging to the seventh process unit group $G_7$ for application of the peripheral light exposure to the wafer W. When the wafer W is transferred into the interface section 13, it is possible to use the peripheral light exposure device (WEE) belonging to the eighth process unit group $G_8$ as the peripheral light exposure device.

In the next step, the wafer W is transferred into the high precision temperature control unit (CPL-$G_5$) belonging to the fifth process unit group $G_5$ and, after taken out from the high precision temperature control unit (CPL-$G_5$) by the first wafer transfer member 62, the wafer W is further transferred into the high precision temperature control unit (CPL-$G_9$) belonging to the ninth process unit group $G_9$. A prescribed temperature control treatment is applied to the wafer W in the high precision temperature control unit (CPL-$G_9$). The wafer W after completion of the processing in the high precision temperature control unit (CPL-$G_9$) is taken out in general from the high precision temperature control unit (CPL-$G_9$) by the second wafer transfer member 63 in a prescribed time.

However, in the occurrence of the situation that the wafer W cannot be transferred into the in-stage 14a of the light exposure device 14 for some reasons such as the adjustment of the light exposure device 14 or in the case where the through-put of the light exposure device 14 is lower than the through-put of the processing for forming a resist film, it is impossible to take out the wafer W from the high precision temperature control unit (CPL-$G_9$), with the result that the wafer W continues to be present in the high precision temperature control unit (CPL-$G_9$). In this case, it is impossible for the first wafer transfer member 62 to transfer the wafer W transferred into the high precision temperature control unit (CPL-$G_5$) into the high precision temperature control unit (CPL-$G_9$).

Under the circumstances, where another wafer W is transferred into the high precision temperature control unit (CPL-G$_5$) while the wafer W is present in the high precision temperature control unit (CPL-G$_9$), the first wafer transfer member 62 transfers said another wafer W into the in-buffer cassette (INBR) belonging to the eighth process unit group G$_8$. Then, after the wafer W is taken out from the high precision temperature control unit (CPL-G$_9$), the first wafer transfer member 62 takes first the wafer W housed in the in-buffer cassette (INBR) in the order of the transfer of the wafers W so as to transfer the wafer W into the high precision temperature control unit (CPL-G$_9$).

Figure 5:
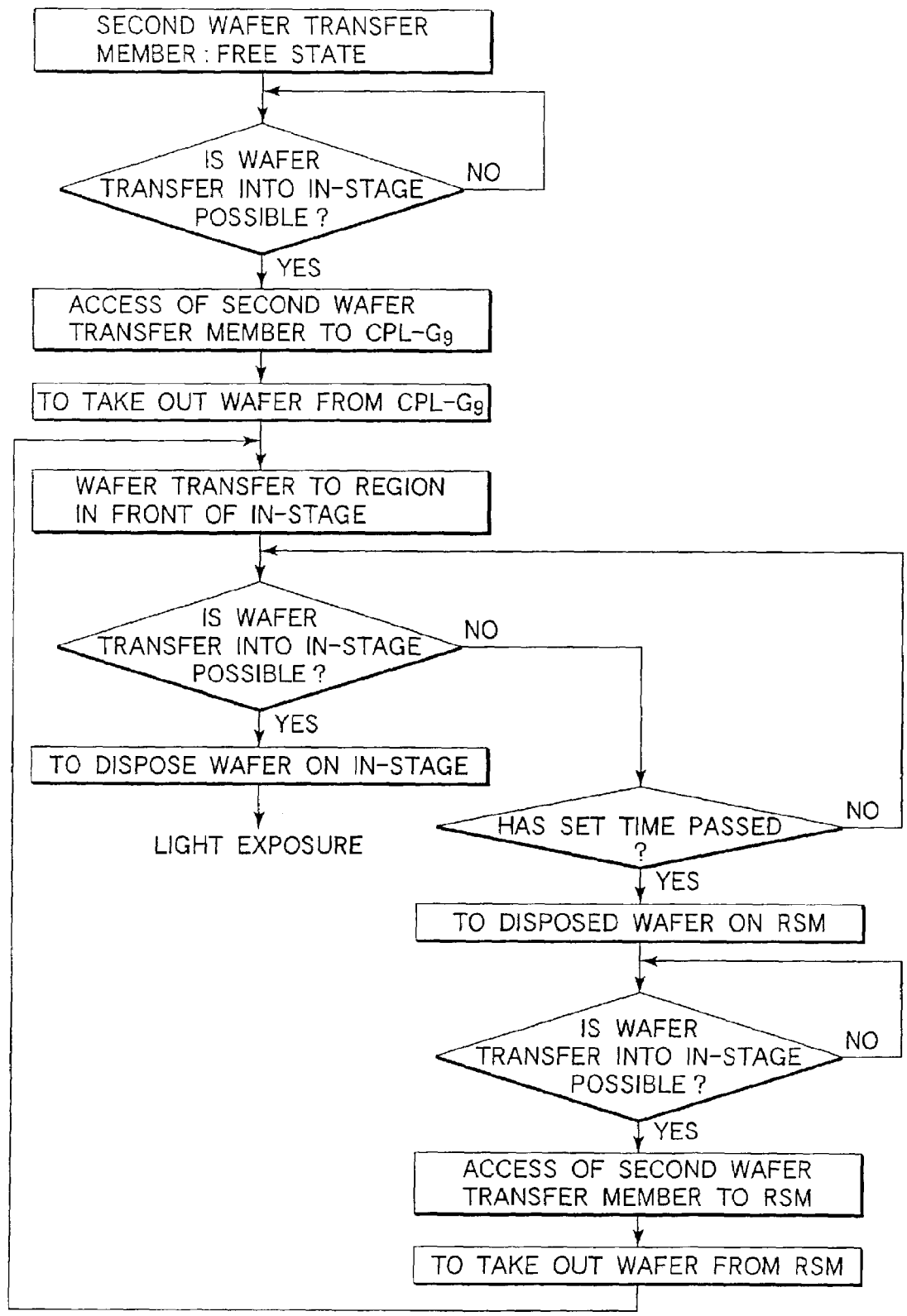
FIG. 5 is a flow chart showing the wafer transfer operation performed by a second wafer transfer member.

FIG. 5 is a flow chart showing the transfer operation of the wafer W performed by the second wafer transfer member 63. As described previously, two kinds of detection signals including a permitting signal for permitting the transfer of the wafer W onto the in-stage 14a and an inhibiting signal for inhibiting the transfer of the wafer W onto the in-stage 14a are transmitted from the light exposure device 14. The second wafer transfer member 63 gains access to the high precision temperature control unit (CPL-G$_9$) in accordance with the permitting signal so as to take out the wafer W from the high precision temperature control unit (CPL-G$_9$). On the other hand, where an inhibiting signal is transmitted from the light exposure device 14, the second wafer transfer member 63 does not perform the operation of taking out the wafer W from the high precision temperature control unit (CPL-G$_9$) until the inhibiting signal is changed to a permitting signal.

The second wafer transfer member 63 that has taken the wafer W out of the high precision temperature control unit (CPL-G$_9$) in accordance with the permitting signal transfers the wafer W to a position in front of the in-stage 14a in order to dispose the wafer W held by the second wafer transfer member 63 on the in-stage 14a. Then, the second wafer transfer member 63 confirms again the detection signal and delivers the wafers W held by the second wafer transfer member 63 onto the in-stage 14a in the case where the detection signal is a permitting signal.

However, there is a case where the wafer W is taken out from the high precision temperature control unit (CPL-G$_9$) in accordance with a permitting signal, but the detection signal is changed to an inhibiting signal before the wafer W is transferred onto the in-stage 14a. In this case, the second wafer transfer member 63 is put under a waiting state for a prescribed time, e.g., 10 seconds, hereinafter referred to as a "waiting time". Where the inhibiting signal is changed to a permitting signal within the waiting time, the second wafer transfer member 63 delivers the wafer W held by the second wafer transfer member 63 onto the in-stage 14a. On the other hand, where the inhibiting signal is not released even after the waiting time, the second wafer transfer member 63 disposes the wafer W held by the second wafer transfer member 63 on the restoration unit (RSM) belonging to the ninth process unit group G$_9$. As a result, the second wafer transfer member 63 is rendered free so as to make it possible for the second wafer transfer member 63 to take out the wafer W disposed on the out-stage 14b of the light exposure unit 14 from the out-stage 14b and, then, to further transfer the wafer W into the transit unit (TRS-G$_9$).

The waiting time can be set at an optional length. Of course, it is possible to set the waiting time at 0 second. In this case, the wafer W can be immediately disposed on the restoration unit (TRS) in the case where the detection signal is changed to an inhibiting signal after the second wafer transfer member 63 has taken the wafer W out of the high precision temperature control unit (CPL-G$_9$).

Incidentally, it is also possible to control the second wafer transfer member 63 to bring the wafer W held by the second wafer transfer member 63 back into the high precision temperature control unit (CPL-G$_9$) in place of the restoration unit (RSM). However, there is a case where the next wafer W is transferred by the first wafer transfer member 62 into the high precision temperature control unit (CPL-G$_9$) after the wafer W is taken out of the high precision temperature control unit (CPL-G$_9$) by the second wafer transfer member 63. If it is tried to transfer further the wafer W held by the second wafer transfer member 63 into the high precision temperature control unit (CPL-G$_9$) under the state that the next wafer W is disposed in the high precision temperature control unit (CPL-G$_9$), it is possible for the delivery of the wafer W within the high precision temperature control unit (CPL-G$_9$) to result in failure so as to break the wafer W. It should be noted, however, that such a breakage of the wafer W can be avoided by provisionally disposing the wafer W on the restoration unit (RSM).

Under the state that the wafer W is disposed on the restoration unit (RSM), the second wafer transfer member 63 does not perform the operation of taking out the wafer W from the high precision temperature control unit (CPL-G$_9$). As a result, it is possible to transfer the wafers W into the light exposure device 14 in the transferring order of the wafers W in the process station 12.

Such being the situation, when the detection signal transmitted from the light exposure device 14 is changed from the inhibiting signal to the permitting signal under the state that the wafer W is disposed on the restoration unit (RSM), the second wafer transfer member 63 takes out the wafer W from the restoration unit (RSM), followed by moving the wafer W to a position in front of the in-stage 14a. After it is confirmed again in the position in front of the in-stage 14a that the detection signal is a permitting signal, the second wafer transfer member 63 delivers the wafer W held by the second wafer transfer member 63 onto the in-stage 14a.

As described above, the restoration unit (RSM) acts as a unit for temporarily disposing thereon the wafer W, but differs in the object of use from the in-buffer cassette (INBR) for temporarily housing the wafer W. To be more specific, the in-buffer cassette (INBR) is a unit into which the wafer W taken out of the high precision temperature control unit (CPL-G$_5$) is transferred under the state that the wafer W is known to be incapable of being transferred into the high precision temperature control unit (CPL-G$_9$), and the in-buffer cassette (INBR) is arranged in order to improve the through-put in the resist coating/developing system 1 and to adjust the difference in the through-put between the resist coating/developing system 1 and the light exposure device 14. The out-buffer cassette (OUTBR) is equal in object to the in-buffer cassette (INBR).

On the other hand, the restoration unit (RSM) is a unit into which the wafer W is provisionally transferred in the case where the wafer W, which was taken out from the high precision temperature control unit (CPL-G$_9$) because it was possible to dispose the wafer W on the in-stage 14a, is rendered incapable of being disposed on the in-stage 14a. The restoration unit (RSM) is arranged in order to protect the wafer W, the in-stage 14a and the second wafer transfer member 63, and to prevent the operation of the second wafer transfer member 63 from being stopped.

The wafer W disposed on the in-stage 14a is transferred within the light exposure device 14 and, after a light exposure is applied to the wafer W, transferred onto the out-stage 14b. The central control section 19 moves the second wafer transfer member 63 toward the out-stage 14b in the case where a transfer-out designating signal is transmitted from the detecting device mounted within the light exposure device 14 and, after it has been confirmed again immediately before the fork 63*a* is allowed to gain access to the out-stage 14*b* that the transfer-out designating signal is transmitted, permits the fork 63*a* to gain access to the out-stage 14*b*. As a result, the wafer W is taken out of the out-stage 14*b*.

The central control section 19 permits moving the second wafer transfer member 63 toward the out-stage 14*b* in the case where a transfer-out designating signal is transmitted from the detecting device mounted in the light exposure device. In addition, where a transfer-out waiting signal is recognized in recognizing again the signal transmitted from the detecting device immediately before the fork 63*a* gains access to the out-stage 14*b*, the central control section 19 permits the fork 63*a* to be in a waiting position until the transfer-out waiting signal is changed to a transfer-out designating signal without allowing the fork 63*a* to gain access to the out-stage 14*b*, or permits the second wafer transfer member 63 to be operated to perform another processing, e.g., to transfer the wafer W from the high precision temperature control unit (CPL-$G_9$) to the in-stage 14*a*.

The wafer W disposed on the out-stage 14*b* in this fashion is transferred by the second wafer transfer member 63 from the out-stage 14*b* into the transit unit (TRS-$G_9$).

The wafer W transferred into the transit unit (TRS-$G_9$) is transferred by the first wafer transfer member 62 into the post-exposure bake unit (PEB) belonging to the fifth process unit group $G_5$ or into the out-buffer cassette (OUTBR) belonging to the eighth process unit group $G_8$. The wafer W is transferred into the out-buffer cassette (OUTBR) in the case where, for example, all the post-exposure bake units (PEB) are being used. The wafers W are transferred out of the out-buffer cassette (OUTBR) in the transfer order of the wafers W from the transit unit (TRS-$G_9$) into the out-buffer cassette (OUTBR) at the time when vacancy is generated in the post-exposure bake unit (PEB) so as to be transferred into the vacant post-exposure bake unit (PEB).

The wafer W after completion of the processing in the post-exposure bake unit (PEB) is transferred by the second main wafer transfer device 17 into the high precision temperature control unit (CPL-$G_5$) belonging to the fifth process unit group $G_5$ so as to receive a temperature control treatment. Then, the wafer W is transferred by the second main wafer transfer device 17 into the developing unit (DEV) belonging to the second process unit group $G_2$ so as to receive a developing processing. Further, the wafer W after completion of the developing processing is transferred by the second main wafer transfer device 17 into the post-bake unit (POST) belonging to the fifth process unit group $G_5$ so as to receive a prescribed heat treatment.

The wafer W after completion of the heat treatment in the post-bake unit (POST) is transferred by the first main wafer transfer device 16 into the high precision temperature control unit (CPL-$G_3$) belonging to the third process unit group $G_3$ so as to receive a temperature control treatment and, then, transferred into the transit unit (TRS-$G_3$) belonging to the third process unit group $G_3$. Finally, the wafer transfer mechanism 21 transfers the wafer W from the transit unit (TRS-$G_3$) to a prescribed position of the wafer cassette CR disposed on the cassette station 11.

Figure 6:
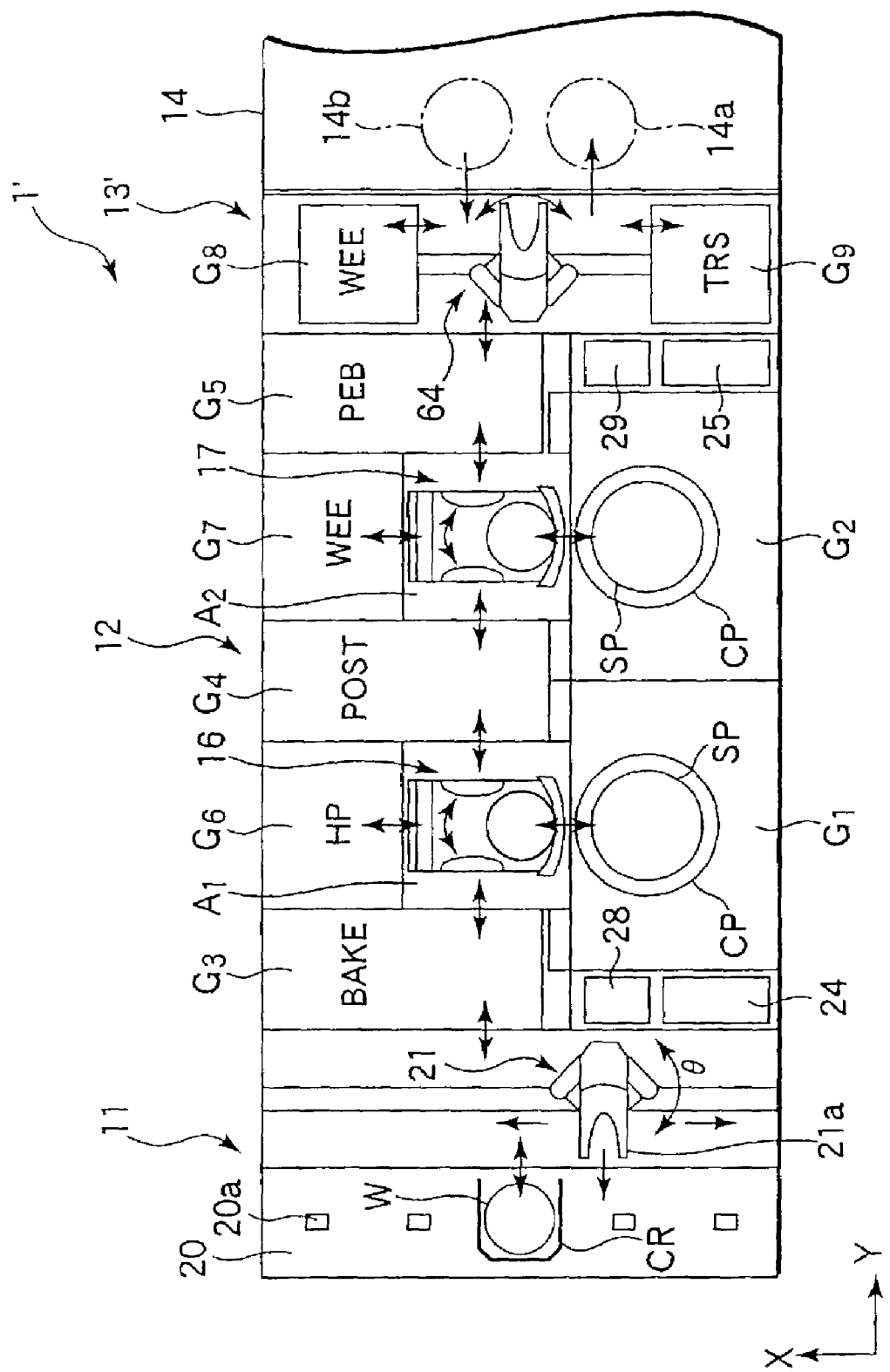
FIG. 6 is a plan view schematically showing the construction of another resist coating/developing system.

The present invention is not limited to the embodiment described above. For example, in the embodiment described above, two transfer devices consisting of the first wafer transfer member 62 and the second wafer transfer member 63 are mounted on the interface station 13. Alternatively, it is possible for the interface section to be constructed as shown in FIG. 6. Specifically, FIG. 6 is a plan view showing the construction of a resist coating/developing system 1'. In this case, the system 1' comprises an interface station 13' equipped with a single wafer transfer member 64.

It is possible for the wafer transfer member 64 to gain access to each of the process units constituting the fifth process unit group $G_5$, the eighth process unit group $G_8$ and the ninth process unit group $G_9$ as well as to the in-stage 14*a* and the out-stage 14*b* mounted in the light exposure device 14.

For example, in the resist coating/developing system 1' shown in FIG. 6, the wafer transfer member 64 alone is capable of gaining access to each of the process units constituting the ninth process unit group $G_9$. Such being the situation, after the wafer W is taken out from the high precision temperature control unit (CPL-$G_9$), the high precision temperature control unit (CPL-$G_9$) is rendered vacant without fail. It follows that it is possible to control the wafer transfer member 64 in a manner to bring the wafer W back into the high precision temperature control unit (CPL-$G_9$) in the case where the detection signal transmitted from the light exposure device 14 is changed to an inhibiting signal after the wafer W is taken out from the high precision temperature control unit (CPL-$G_9$) in accordance with a permitting signal transmitted from the light exposure device 14.

However, there is a case where, for example, the wafer W is rendered incapable of being transferred into any of the high precision temperature control unit (CPL-$G_9$) and the in-buffer cassette (INBR) on the receiving side after the wafer W is taken out by the wafer transfer member 64 from the high precision temperature control unit (CPL-$G_5$) and, in addition, the next wafer W is transferred by the second main wafer transfer device 17 into the high precision temperature control unit (CPL-$G_5$). If the restoration unit (RSM) is mounted within the interface station 13', it is possible to dispose provisionally the wafer W held by the wafer transfer member 64 on the restoration unit (RSM) in the event of such a situation so as to render the wafer transfer member 64 free.

Incidentally, it is possible for the wafer transfer member 64 to transfer the wafer W from the out-stage 14*b* directly into the post-exposure bake unit (PEB) belonging to the fifth process unit group $G_5$ or into the out-buffer cassette (OUTBR) belonging to the eighth process unit group $G_8$. Such being the situation, the transit unit (TRS-$G_9$) is not absolutely required in the resist coating/developing system 1' shown in FIG. 6.

In the description given above, the restoration unit (RSM) is mounted to the interface station 13 or 13'. However, it is also possible to mount the restoration unit (RSM) in the process station 12. For example, in the case where the wafer W held by the first main wafer transfer device 16 is rendered incapable of being transferred into the process unit on the receiving side because an alarm is generated from the process unit on the receiving side after the wafer W is taken out of a certain process unit by the first main wafer transfer device 16, the central control section 19 controls the first main wafer transfer device 16 in a manner to dispose the wafer W held by the first main wafer transfer device 16 on the restoration unit (RSM) in a retreating fashion.

In the resist coating/developing system 1, it is possible to mount a line width measuring device for measuring the line width of the resist pattern formed on the wafer W and a defect inspecting device for inspecting, for example, the scratch on the surface of the resist film (scratch detection), the dust particle mixed in the coating stage of the resist solution (commet detection), an uneven development, and a developing defect after the developing processing. It is possible to arrange such a measuring device/inspecting device in a position where, for example, the wafer transfer mechanism 21 is capable of gaining access to the measuring device/inspecting device.

In the description given above, a semiconductor wafer is taken up as a substrate to be processed. Alternatively, it is possible for the substrate processed in the present invention to be a glass substrate used in a liquid crystal display (LCD) device or a reticle substrate used in a photo mask. Also, the resist coating/developing treatment is taken up in the description given above as the processing applied to the substrate. However, it is also possible to apply the technical idea of the present invention to the substrate processing apparatus for carrying out various processing such as a cleaning processing, a coating processing of an interlayer insulating film, and an etching processing.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A substrate processing apparatus, comprising:
   a first process unit for applying a first processing to a substrate;
   a second process unit for applying a second processing to the substrate upon completion of the first processing applied by said first process unit;
   a substrate transfer device for transferring the substrate between the first process unit and the second process unit;
   a control device for controlling said substrate transfer device;
   a detecting mechanism for detecting whether the second process unit is in the state of permitting or inhibiting the transfer of the substrate thereinto so as to transmit to the control device a permitting signal for permitting the transfer of the substrate into the second process unit and an inhibiting signal for inhibiting the transfer of the substrate into the second process unit; and
   a provisional substrate disposing unit for provisionally disposing the substrate transferred out of the first process unit;
   wherein, the control device controls the substrate transfer device such that the substrate is disposed on the provisional substrate disposing unit where the control device has received the inhibiting signal transmitted from the detecting mechanism after the control device has permitted the substrate transfer device to take out the substrate from the first process unit in accordance with the permitting signal transmitted from the detecting mechanism; and
   wherein the control device controls the substrate transfer device such that the substrate transfer device takes out the substrate from the first unit after the control device confirms again that a signal transmitted from the detecting mechanism to the control device is the permitting signal immediately before the substrate transfer device is allowed to gain access to the first unit.

2. The substrate processing apparatus according to claim 1, wherein the control device controls the substrate transfer device in a manner to transfer first the substrate disposed on the provisional substrate disposing unit into the second process unit in the case where the substrate is disposed on the provisional substrate disposing unit when the signal transmitted from the detecting mechanism into the control device is changed from the inhibiting signal to the permitting signal.

3. A substrate processing apparatus comprising:
   a cassette station on which is disposed a cassette having a plurality of substrates housed therein;
   a process station for applying a prescribed processing to the substrate;
   a first substrate transfer device for transferring the substrate between the cassette station and the process station;
   an interface station including a second substrate transfer device for transferring the substrate between another substrate processing apparatus arranged adjacent to the process station and the process station and a provisional substrate disposing unit for provisionally disposing thereon the substrate taken out from the process station;
   a control device for controlling the second substrate transfer device; and
   a detecting mechanism for detecting whether said another substrate processing apparatus is in the state of permitting or inhibiting the transfer of the substrate and for transmitting to the control device a permitting signal for permitting the transfer of the substrate into said another substrate processing apparatus and an inhibiting signal for inhibiting the transfer of the substrate into said another substrate processing apparatus;
   wherein the control device controls the second substrate transfer device such that the substrate is disposed on the provisional substrate disposing unit where the control device has received the inhibiting signal transmitted from the detecting mechanism after the control device has permitted the second substrate transfer device to take out the substrate from the process station in accordance with the permitting signal transmitted from the detecting mechanism; and
   wherein the control device controls the second substrate transfer device such that the second substrate transfer device takes out the substrate from the process station after the control device confirms again that a signal transmitted from the detecting mechanism to the control device is the permitting signal immediately before the second substrate transfer device is allowed to gain access to the process station.

4. The substrate processing apparatus according to claim 3, wherein, where the substrate is disposed on the provisional substrate disposing unit when the signal transmitted from the detecting mechanism to the control device is changed from the inhibiting signal to the permitting signal, the control device controls the second substrate transfer device such that the substrate disposed on the provisional substrate disposing unit is transferred first into said another substrate processing apparatus.

5. The substrate processing apparatus according to claim 3, wherein, where the substrate is disposed on the provisional substrate disposing unit when the signal transmitted from the detecting mechanism to the control device is changed from the inhibiting signal to the permitting signal, the control device controls the second substrate transfer device such that the substrate disposed on the provisional substrate disposing unit is transferred first into the light exposure device.

6. A substrate processing apparatus for applying to a substrate a series of processes ranging between the formation of a resist film and the development, comprising:

- a cassette station on which is disposed a cassette having a plurality of substrates housed therein;
- a process station including a plurality of process units for applying to the substrate processes to form a resist film on the substrate and to develop the resist film and the heat treatments accompanying the formation and development of the resist film;
- a first substrate transfer device for transferring the substrate between the cassette station and the process station;
- an interface station including a second substrate transfer device for transferring the substrate between a light exposure device arranged adjacent to the process station and the process station and a provisional substrate disposing unit for provisionally disposing thereon the substrate transferred out of the process station;
- a control device for controlling the second substrate transfer device; and
- a detecting mechanism for detecting whether the light exposure device is in the state of permitting or inhibiting the transfer of the substrate thereinto so as to transmit to the control device a permitting signal for permitting the transfer of the substrate into the light exposure device and an inhibiting signal for inhibiting the transfer of the substrate into the light exposure device;
- wherein the control device controls the second substrate transfer device such that the substrate is disposed on the provisional substrate disposing unit where the control device has received the inhibiting signal transmitted from the detecting mechanism after the control device has permitted the second substrate transfer device to take out the substrate from the process station in accordance with the permitting signal transmitted from the detecting mechanism; and
- wherein the control device controls the second substrate transfer device such that the second substrate transfer device takes out the substrate from the process station after the control device confirms again that a signal transmitted from the detecting mechanism to the control device is the permitting signal immediately before the second substrate transfer device is allowed to gain access to the process station.

7. The substrate processing apparatus according to claim 6, wherein, where the substrate is disposed on the provisional substrate disposing unit when the signal transmitted from the detecting mechanism to the control device is changed from the inhibiting signal to the permitting signal, the control device controls the second substrate transfer device such that the substrate disposed on the provisional substrate disposing unit is transferred first into said another substrate processing apparatus.

8. The substrate processing apparatus according to claim 6, wherein, where the substrate is disposed on the provisional substrate disposing unit when the signal transmitted from the detecting mechanism to the control device is changed from the inhibiting signal to the permitting signal, the control device controls the second substrate transfer device such that the substrate disposed on the provisional substrate disposing unit is transferred first into the light exposure device.

9. A substrate processing apparatus, comprising:
- a cassette station on which is disposed a cassette having a plurality of substrates housed therein;
- a process station for applying a prescribed processing to the substrate;
- a first substrate transfer device for transferring the substrate between the cassette station and the process station;
- an interface station including a substrate disposing unit for disposing thereon only that substrate which is to be transferred to another substrate processing apparatus arranged adjacent to the process station, a second substrate transfer device capable of transferring the substrate between the process station and the substrate disposing unit, a third substrate transfer device capable of transferring the substrate between the substrate disposing unit and said another substrate processing apparatus, and a provisional substrate disposing unit arranged in parallel to the substrate disposing unit for provisionally disposing thereon the substrate taken out from the substrate disposing unit;
- a control device for controlling the third substrate transfer device; and
- a detecting mechanism for detecting whether said another substrate processing apparatus is in the state of permitting or inhibiting the transfer of the substrate thereinto so as to transmit to the control device a permitting signal for permitting the transfer of the substrate into said another substrate processing apparatus and an inhibiting signal for inhibiting the transfer of the substrate into said another substrate processing apparatus;
- wherein the control device controls the third substrate transfer device such that the substrate is disposed on the provisional substrate disposing unit where the control device has received the inhibiting signal transmitted from the detecting mechanism after the control device has permitted the third substrate transfer device to take out the substrate from the substrate disposing unit in accordance with the permitting signal transmitted from the detecting mechanism.

10. The substrate processing apparatus according to claim 9, wherein, where the substrate is disposed on the provisional substrate disposing unit when the signal transmitted from the detecting mechanism to the control device is changed from the inhibiting signal to the permitting signal, the control device controls the third substrate transfer device such that the substrate disposed on the provisional substrate disposing unit is transferred first into said another substrate processing apparatus.

11. The substrate processing apparatus according to claim 9, wherein the control device controls the third substrate transfer device such that the third substrate transfer device takes out the substrate from the substrate disposing unit after the control device confirms again that a signal transmitted from the detecting mechanism to the control device is the permitting signal immediately before the third substrate transfer device is allowed to gain access to the substrate disposing unit.

12. The substrate processing apparatus according to claim 9, wherein the interface station further includes:
- a first substrate housing unit for housing a substrate that is to be transferred from the process station to said another substrate processing apparatus, the substrate being transferred into and out of said first substrate housing unit by the second substrate transfer device;
- a second substrate housing unit for housing a substrate that is to be transferred from said another substrate processing apparatus to the process station, the substrate being transferred into and out of said second substrate housing unit by the second substrate transfer device; and another substrate disposing unit arranged in parallel to the substrate disposing unit for disposing thereon that substrate alone which is to be returned from said another substrate processing apparatus to the process station;

wherein, where the inhibiting signal is transmitted from the detecting mechanism, the second substrate transfer device carries out any of the processes of (a) housing the substrate after completion of a prescribed processing in the process station in the first substrate housing unit, (b) housing the substrate disposed on said another substrate disposing unit in the second substrate housing unit, (c) transferring the substrate disposed on said another substrate disposing unit to the process station, and (d) transferring the substrate housed in the second substrate housing unit to the process station.

13. A substrate processing apparatus, comprising:
a process unit for applying a prescribed treatment to a substrate;
a substrate transfer device including a transfer-out member for taking out the substrate from the process unit;
a control device for controlling the substrate transfer device; and
a detecting mechanism for detecting whether the process unit is in the state of permitting or inhibiting the taking out of the substrate therefrom so as to transmit to the control device a permitting signal for permitting the access of the substrate transfer device to the process unit and an inhibiting signal for inhibiting the access of the substrate transfer device to the process unit;
wherein the control device controls the substrate transfer device such that the substrate transfer device is allowed to start its operation to gain access to the process unit in accordance with the permitting signal transmitted from the detecting mechanism, the control device confirms again the signal transmitted from the detecting mechanism immediately before the transfer-out member is allowed to gain access to the process unit after the start-up of the operation of the substrate transfer device to gain access to the process unit, the transfer-out member is allowed to gain access to the process unit in the case where the signal transmitted from the detecting mechanism is reconfirmed to be a permitting signal so as to take out the substrate from the process unit, and the access of the transfer-out member to the process unit is stopped in the case where the signal is changed to the inhibiting signal.

14. A substrate processing apparatus, comprising:
a cassette station for disposing thereon a cassette having a plurality of substrates housed therein;
a process station for applying a prescribed processing to the substrate
a first substrate transfer device for transferring the substrate between the cassette station and the process station;
an interface station including a second substrate transfer device for transferring the substrate between another substrate processing apparatus arranged adjacent to the process station and the process station;
a control device for controlling the second substrate transfer device; and
a detecting mechanism for detecting whether the another substrate processing apparatus is in the state of permitting or inhibiting the taking out the substrate therefrom so as to transmit to the control device a permitting signal for permitting the access of the second substrate transfer device to said another substrate processing apparatus and an inhibiting signal for inhibiting the access of the second substrate transfer device to said another substrate processing apparatus;
wherein:
the second substrate transfer device includes a transfer-out member for taking out the substrate from said another substrate processing apparatus; and
the control device controls the second substrate transfer device such that the operation of the second substrate transfer device to gain access to said another substrate processing apparatus is started in accordance with the permitting signal transmitted from the detecting mechanism, the control device confirms again the signal transmitted from the detecting mechanism immediately before the transfer-out member is allowed to gain access to said another substrate processing apparatus after start up of the operation of the second substrate transfer device to gain access to said another substrate processing apparatus, the transfer-out member is allowed to gain access to said another substrate processing apparatus in the case where the signal transmitted from the detecting signal is reconfirmed to be the permitting signal so as to take out the substrate from said another substrate processing apparatus, and the access of the transfer-out member to said another substrate processing apparatus is stopped in the case where the signal is changed to the inhibiting signal.

15. A substrate processing apparatus for applying a series of processes ranging between the formation of a resist film and the development to a substrate, comprising:
a cassette station for disposing thereon a cassette having a plurality of substrates housed therein;
a process station including a plurality of process units for forming a resist film on the substrate and applying a developing processing to the resist film and for applying heat treatments accompanying the formation of the resist film and the developing processing to the substrate;
a first substrate transfer device for transferring the substrate between the cassette station and the process station;
an interface station including a second substrate transfer device for transferring the substrate between a light exposure device arranged adjacent to the process station and the process station and a provisional substrate disposing unit for provisionally disposing thereon the substrate taken out from the process station;
a control device for controlling the second substrate transfer device; and
a detecting mechanism for detecting whether the light exposure device is in the state of permitting or inhibiting the transfer of the substrate thereinto so as to transmit to the control device a permitting signal for permitting the transfer of the substrate into the light exposure device and an inhibiting signal for inhibiting the transfer of the substrate into the light exposure device;
wherein:
the second substrate transfer device includes a transfer-out member for taking out the substrate from the light exposure device; and
the control device controls the second substrate transfer device such that the second substrate transfer device is allowed to start its operation to gain access to the light exposure device in accordance with the permitting signal transmitted from the detecting mechanism, the control devices confirms again the signal transmitted from the detecting mechanism immediately before the transfer-out member of the second substrate transfer device gains access to the light exposure device after start-up of the operation of the second substrate transfer device to gain access to the light exposure device, the transfer-out member is allowed to gain access to the light exposure device in the case where the signal transmitted from the detecting mechanism is reconfirmed to be the permitting signal so as to take out the substrate from the light exposure device, and the access of the transfer-out member to the light exposure device is stopped in the case where the signal is changed to the inhibiting signal.

16. A method of transferring a substrate from a first process unit to a second process unit by a substrate transfer device, said first process unit being for applying a first processing to the substrate, and said second process unit being for applying a second processing to the substrate, comprising the steps of:

taking out the substrate after completion of the first processing from the first process unit after the second process unit is reconfirmed to be in the state of permitting the transfer of the substrate thereinto;

reconfirming whether the second process unit is in the state of permitting or inhibiting the transfer of the substrate thereinto immediately before the substrate is transferred into the second process unit;

controlling the substrate transfer device such that the substrate is transferred into the second process unit when the second process unit is reconfirmed to be in the state of permitting the transferring the substrate thereinto, such that the substrate is transferred into the second process unit at a time when the second process unit is changed from the state of permitting the transfer of the substrate into the state of inhibiting the transfer of the substrate and the second process unit is changed into the sate of permitting the transfer of the substrate in a prescribed time from the reconfirming time, and such that the substrate is provisionally disposed on a provisional substrate disposing unit the prescribed time later when the second process unit is changed from the state of permitting the transfer of the substrate into the state of inhibiting the transfer of the substrate and the second process unit is not changed into the state of permitting the transfer of the substrate in the prescribed time after the reconfirming time;

taking out the substrate from the provisional substrate disposing unit when the second process unit is changed from the state of inhibiting the transfer of the substrate into the state of permitting the transfer of the substrate after the substrate is disposed on the provisional substrate disposing unit; and transferring the substrate while confirming the state of the second process unit until the substrate taken out from provisional substrate disposing unit is transferred into the second process unit.

17. A method of transferring a substrate from a resist coating/developing section to a light exposure section by a substrate transfer device, said resist coating/developing section including a plurality of process units for forming a resist film on a substrate, developing the formed resist film and applying heat treatments accompanying the formation and development of the resist film to the substrate, and said light exposure section being for applying a light exposure to the substrate having the resist film formed thereon, comprising the steps of:

taking out the substrate having the resist film formed thereon from the resist coating/developing section after the light exposure section is confirmed to be in the state of permitting the transfer of the substrate thereinto;

reconfirming whether the light exposure section is in the state of permitting or inhibiting the transfer of the substrate thereinto immediately before the substrate is transferred into the light exposure section;

controlling the substrate transfer device such that the substrate is transferred into the light exposure section when the light exposure section is reconfirmed to be in the state of permitting the transfer of the substrate thereinto, such that the substrate is transferred into the light exposure section at the time when the light exposure section is changed from the state of permitting the transfer of the substrate into the state of inhibiting the transfer of the substrate and the light exposure section is changed into the state of permitting the transfer of the substrate in a prescribed time after the reconfirming time, and such that the substrate is provisionally disposed on a provisional substrate disposing unit the prescribed time later when the light exposure section is changed from the state of permitting the transfer of the substrate into the state of inhibiting the transfer of the substrate and the light exposure section is not changed into the state of permitting the transfer of the substrate in the prescribed time after the reconfirming time;

taking out the substrate from the provisional substrate disposing unit when the light exposure section is changed from the state of inhibiting the transfer of the substrate into the state of permitting the transfer of the substrate after the substrate is disposed on the provisional substrate disposing unit; and transferring the substrate while confirming the state of the light exposure section until the substrate taken out from the provisional substrate disposing unit is transferred into the light exposure section.

* * * * *